(12) United States Patent
Egami et al.

(10) Patent No.: US 8,007,633 B2
(45) Date of Patent: Aug. 30, 2011

(54) SURFACE PROCESSING APPARATUS

(75) Inventors: Akihiro Egami, Ebina (JP); Masayoshi Ikeda, Hachioji (JP); Yasumi Sago, Tachikawa (JP); Yukito Nakagawa, Tachikawa (JP)

(73) Assignee: Canon Anelva Corporation, Fuchu (JP)

( * ) Notice: Subject to any disclaimer, the term of this patent is extended or adjusted under 35 U.S.C. 154(b) by 0 days.

(21) Appl. No.: 13/064,484

(22) Filed: Mar. 28, 2011

(65) Prior Publication Data

US 2011/0174221 A1 Jul. 21, 2011

Related U.S. Application Data

(63) Continuation of application No. 10/211,367, filed on Aug. 5, 2002, now abandoned.

(30) Foreign Application Priority Data

Aug. 6, 2001 (JP) .................................. 2001-238279
Aug. 6, 2001 (JP) .................................. 2001-238280

(51) Int. Cl.
*C23C 16/00* (2006.01)
*H01L 21/00* (2006.01)
(52) U.S. Cl. ................................................. 156/345.46
(58) Field of Classification Search ........... 118/723 MA, 118/723 MR; 156/345.42, 345.46, 345.49
See application file for complete search history.

(56) References Cited

U.S. PATENT DOCUMENTS

| | | | |
|---|---|---|---|
| 5,082,542 A * | 1/1992 | Moslehi et al. | 204/192.32 |
| 5,192,849 A * | 3/1993 | Moslehi | 219/121.43 |
| 5,620,522 A | 4/1997 | Ichimura et al. | |
| 6,000,360 A | 12/1999 | Koshimizu | |
| 6,216,632 B1 | 4/2001 | Wickramanayaka | |
| 6,333,601 B1 * | 12/2001 | Wickramanayaka | 315/111.41 |
| 6,432,261 B2 * | 8/2002 | Watanabe et al. | 156/345.47 |
| 6,462,482 B1 | 10/2002 | Wickramanayaka et al. | |
| 2001/0008173 A1 * | 7/2001 | Watanabe et al. | 156/345 |

FOREIGN PATENT DOCUMENTS

| | | |
|---|---|---|
| JP | A-06-069163 | 3/1994 |
| JP | A-0-316779 | 11/1994 |

(Continued)

OTHER PUBLICATIONS

Jul. 23, 2010 Office Action issued in U.S. Appl. No. 12/003,456.

*Primary Examiner* — Ram Kackar
*Assistant Examiner* — Anna Crowell
(74) *Attorney, Agent, or Firm* — Oliff & Berridge, PLC

(57) ABSTRACT

This surface processing apparatus has a reactor in which plasma is generated and a substrate whose surface is to be processed by the plasma is arranged, and a magnet plate for creating a point-cusp magnetic field distributed in an inner space of the reactor, in which the plasma is generated. The magnet plate has a plurality of magnets. These magnets are arranged by a honeycomb lattice structure in a circular plane facing in parallel a surface of the substrate. One magnetic pole end face of each of magnets is arranged at a position of each of the lattice points forming hexagonal shapes on the circular plane. The polarities of the magnetic pole end faces of two adjoining magnets are arranged to become opposite alternately. The magnet plate may be provided with a plurality of magnets arranged by a lattice structure forming a square and the magnetic force (coercive force) of some of the magnets arranged at the outermost region is reduced. Thereby, the periodicity of the point-cusp magnetic field in the inside space is maintained as much as possible even at the peripheral edge and the asymmetry of the distribution of the magnetic field at the region where the periodicity is disturbed at the peripheral edge is reduced.

3 Claims, 16 Drawing Sheets

FOREIGN PATENT DOCUMENTS

| | | |
|---|---|---|
| JP | A-06-325899 | 11/1994 |
| JP | A-08-288096 | 11/1996 |
| JP | A-11-283926 | 10/1999 |
| JP | A-2000-036486 | 2/2000 |
| JP | A-2000-144411 | 5/2000 |
| JP | 2002363740 A * | 12/2002 |

* cited by examiner

SURFACE PROCESSING APPARATUS

This is a Continuation of application Ser. No. 10/211,367 filed Aug. 5, 2002. The disclosure of the prior application is hereby incorporated by reference herein in its entirety.

BACKGROUND OF THE INVENTION

1. Field of the Invention

The present invention relates to a surface processing apparatus, more particularly relates to a surface processing apparatus for processing a substrate surface using plasma. This surface processing apparatus is used for the fabrication of integrated circuits in the semiconductor industry. The surface processing apparatus has a plasma source for supplying ions, electrons, neutral radicals, etc. useful for formation of an insulating film, interconnect metal, gate electrode materials, etc. on a substrate or minutely processing the substrate surface. This plasma source creates plasma inside a reactor. The distribution of this plasma is controlled by a point-cusp magnetic field.

2. Description of the Related Art

The configuration of a representative surface processing apparatus of the related art will be explained first with reference to FIG. 18. FIG. 18 is a schematic view of a surface processing apparatus. This surface processing apparatus is provided with a reactor (vacuum tank or processing chamber) made of metal plate and evacuated by an attached vacuum pump 11 to a predetermined vacuum state. The reactor 12 is provided inside it with, for example, in the form of a parallel plate type electrode structure, an electrode (cathode) 13 positioned at the top and an electrode (substrate electrode) 15 positioned at the bottom and supporting the substrate (or wafer) 14. Illustration of the support structure of the electrode 15 is omitted. The substrate 14 loaded on the substrate electrode 15 is carried into through a substrate entry port 16 by a transport device (not shown). After performing predetermined processing on the substrate 14 placed on the substrate electrode 15, the substrate 14 is carried out through a substrate exit port 17. When processing the substrate 14 in the reactor 12, the inside space of the reactor 12 is evacuated to a required vacuum state, a process gas is introduced, the power feed conditions are met and plasma is generated in the front space of the substrate 14, and the substrate surface is processed by the plasma. Illustration of the mechanism for introduction of the process gas is omitted.

Looking at the configuration of the reactor 12 of the surface processing apparatus, further, the reactor 12 is held at the ground potential 18. In attachment, the cathode 13 and the substrate electrode 15 are electrically insulated from the reactor 12. In the illustrated example, the detailed structure for the insulation is omitted. Further, high frequency power sources 19 and 20 are connected independently to the cathode 13 and substrate electrode 15. These electrodes are independently supplied with high frequency power. The frequency and amount of the high frequency power are freely set in accordance with the objective.

Further, the substrate 14 arranged on the substrate electrode 15 is held by an electrostatic chucking mechanism 15a or the like. In this way, the substrate electrode 15 has the structure of a substrate holder. A predetermined amount of argon or another process gas for the surface processing or treatment of the substrate 14 is introduced into the reactor 12 and the inner pressure of the reactor 12 is maintained at a vacuum of about 1 to 10 Pa.

The back surface of the cathode 13 has a magnet plate 22 provided with a large number of magnets (permanent or coil magnets) 21. The magnet plate 22 is comprised of a plate member 22a made of a nonmagnetic member, on which a large number of rod-shaped or block-shaped magnets 21 are affixed. The rod-shaped magnets 21 all have the same length and same magnetic strength. Opposing magnetic poles (N poles and S poles) are formed on the two end faces of each magnets 21, with one end face fixed to the plate member 22a. In the magnet plate 22, the large number of magnets 21 are fixed to the surface of the plate member 22a so that their longitudinal directions are perpendicular to the surface. In the magnet plate 22, the magnetic pole end faces of the large number of magnets 18 facing the surface of the plate member 22a are arranged so as to differ among the nearest adjoining magnets. As shown in FIG. 18, N poles and S poles are arranged alternately at equal distances on the surface of the plate member 22a. Note that the magnet plate 22 may be arranged in the reactor 12 by placing the plate member 22a at the cathode 13 side or conversely placing the magnets 21 at the cathode 13 side.

As a prior art reference disclosing a structure relating to the arrangement of the large number of magnets, Japanese Unexamined Patent Publication (Kokai) No. 11-283926 (see FIG. 1, FIG. 3, FIG. 4, etc.) previously filed by the same assignee may be mentioned. Further, as other references, Japanese Unexamined Patent Publication (Kokai) Nos. 2000-144411, 6-69163, 6-316779, 8-288096, etc. may be mentioned.

In the reactor 12 of the surface processing apparatus, the surface of the substrate 13 placed on the substrate electrode 15 is processed or treated by the plasma generated at the front space 23 of the substrate 14, that is, the lower-side space of the cathode 13. This plasma is generated, for example, by electrostatic coupling of high frequency power.

FIG. 19 is a plan view of the magnet plate 22. FIG. 19 shows the arrangement of the large number of magnets 21 provided on the magnet plate 22 by a plan view. In FIG. 19, the large number of small diameter circles 21a show the end face positions and polarities of the magnetic poles of the cylindrical rod-shaped magnets 21. The plan shape of the magnet plate 22 is a circular one of substantially the same diameter as the plan shape of the substrate 14 or cathode 13. In the circular magnet plate 22, the large number of magnets 21 are arranged so as to be positioned at the four apexes of squares. This arrangement deems the positions of arrangement of the magnets to be lattice points of squares and is therefore called a "square lattice structure". According to this square lattice structure, the periodicity of the square lattice array is maintained in the center region of the magnet plate 22, but at the peripheral edge region, the periodicity is disturbed due to the circular contour. In the example shown in FIG. 19, for example, regions 24 where magnets 21 of the same polarity (N pole) and magnets 21 of the opposite polarity (S pole) are arranged in single lines are formed at four locations. Any two nearest adjoining magnets 21 (except at diagonal positions) are in an equal distance positional relationship. In FIG. 19, the hatched circles 21a mean end faces of N poles of the magnets 21, while the remaining simple circles 21a mean end faces of S poles the magnets 21. The polarity of each of the large number of magnets 21 arranged at any square lattice point is opposite to the polarities of the other adjoining magnets 21 arranged at the nearest lattice points. In FIG. 19, the length of one side forming the square is for example 2 cm, while the diameter of the circular end face 21a of each magnet 21 is for example 8 mm.

At the inner space of the cathode 13 in the reactor 12, a cusp magnetic field is formed based on the above arrangement of the large number of magnets 21 on the magnet plate 22 arranged at the back surface of the cathode 13. This cusp magnetic field is a point-cusp magnetic field formed by the formation of magnetic field lines from the N pole toward the surrounding S poles. The large number of magnets 22 are arranged in periodic square lattice shapes in the same plane by the same magnetic force (coercive force), so the point-cusp magnetic field is also formed by a periodic distribution.

In the above surface processing apparatus, above the cathode 13 having the circular planar shape, the large number of magnets 21 are arranged in a square lattice structure due to the magnet plate 22 while being restricted by the circular attachment surface of the plate member 22a. According to this magnet array, at the inside region of the cathode 13 in the reactor 12 corresponding to the region in which the square lattice structure is maintained with accurate periodicity, the above point-cusp magnetic field is periodically repeated by the same distribution of strength. On the other hand, at the peripheral edge of the cathode 13, the periodicity of the magnet array is disturbed due to the restrictions due to the circular contour and the magnetic field lines have nowhere to go, so the magnetic field strength caused in the corresponding inside region changes and the distribution in the radial direction seen from the center of the substrate 13 becomes greatly different. In general, at the inside region of the cathode 13 in the reactor 12, the plasma density is made uniform over a broad range by causing the plasma generated in the strong magnetic field present in the region near the magnet plate 22 to diffuse in the weak magnetic field away from the magnet plate 22. According to the configuration of the conventional surface processing apparatus, however, as explained above, the weak magnetic field becomes non-uniform at the space away from the magnet plate 22 and the distribution of the magnetic field is disturbed at the peripheral edge so the density and diffusion direction of the ions and electrons in the plasma are not uniform. Therefore, the problem arises that the surface processing of the substrate 14 by the plasma becomes non-uniform.

Explaining the problem in more detail, according to the magnet plate 22 having an arrangement of magnets 21 of a square lattice structure, a strong line cusp appears at the diagonal direction 25 of the unit square lattices in a space for example at least 10 mm from the magnet plate at the peripheral edge of the magnet plate 22. As a result, there was the problem that the results of the surface processing of the substrate region corresponding to that space differed from the results of surface processing of the substrate region corresponding to another space.

SUMMARY OF THE INVENTION

An object of the present invention is to solve the above problems and provide a surface processing apparatus maintaining as much as possible the periodicity of a point-cusp magnetic field created in an inside space of a reactor, reducing the asymmetry of the distribution of the magnetic field in a region of disturbance of periodicity at the peripheral edge, maintaining symmetry of the point-cusp magnetic field without making any major changes in the hardware configuration, and enabling uniform surface processing.

According to a first aspect of the present invention, in order to achieve the above object, there is provided a surface processing apparatus configured as follows.

The surface processing apparatus is provided with a reactor in which plasma is generated and in which a processed object whose surface is to be processed by the plasma is arranged, and a magnet plate for creating a point-cusp magnetic field distributed in a space in the reactor in which the plasma is generated. The magnet plate is provided with a plurality of magnets arranged in a circular plane facing in parallel a surface of the object to be processed. One magnetic pole end face of each of the plurality of magnets is arranged at a position of each of the lattice points forming hexagonal shapes on the circular plane. Further, the polarities of the magnetic pole end faces of two adjoining magnets are arranged to become opposite.

In the above surface processing apparatus, the large number of magnets of the magnet plate creating the periodic point-cusp magnetic field in the inside or lower space of the cathode are arranged in an array of a honeycomb lattice structure having hexagonal shapes as unit lattices. Therefore, arrangement to suppress disturbance in the periodicity as much as possible becomes possible and the destinations of magnetic field lines of the point-cusp magnetic field at the peripheral edge of the magnet plate where the periodicity is easily disturbed are set and closed. Due to this, the periodicity of the magnetic field corresponding to the peripheral edge of the magnet plate is maintained as much as possible and the uniformity of the processing at the corresponding portion of the substrate is heightened.

In the surface processing apparatus of the present invention, the hexagonal shape is preferably a regular hexagonal shape. With a regular hexagonal honeycomb lattice structure, it is possible to arrange the honeycomb lattices with a high uniformity by a dense distribution on the magnet plate.

In the surface processing apparatus of the present invention, the hexagonal shape preferably has three pairs of parallel facing sides and different lengths of each pair of sides. With a honeycomb lattice structure, the unit honeycomb lattices do not have to be strictly regular hexagons. The shapes can be freely changed.

In the surface processing apparatus of the present invention, preferably the longest side is not more than two times the shortest side. This configuration is preferable to effectively achieve the effect of suppressing disturbances of the periodicity of the point-cusp magnetic field at the peripheral edge of the magnet plate.

In the surface processing apparatus of the present invention, preferably at least two magnets are arranged at each of the lattice points of the hexagonal shapes. With this configuration as well, similar actions can be caused.

In the surface processing apparatus of the present invention, preferably other magnets of reduced magnetic force are arranged at an outermost region of the circular plane and disturbances in periodicity of unit lattices are corrected. Due to this configuration, it is possible to maintain the periodicity of the point-cusp magnetic field at the peripheral edge of the magnet plate as high as possible. Further, in the surface processing apparatus of the present invention, the lengths of the other magnets can be made shorter to reduce the magnetic force.

According to the surface processing apparatus of the present invention, since the large number of magnets arranged on the magnet plate are arranged using a honeycomb lattice structure, the periodicity of the point-cusp magnetic field created in the inside space of the reactor can be maintained as much as possible. Therefore, it is possible to reduce the asymmetry of the distribution of the magnetic field in the region of disturbance in periodicity at the peripheral edge, maintain the symmetry of the point-cusp magnetic field without making major changes to the hardware configuration, and process the surface of the substrate uniformly.

According to a second aspect of the invention, there is provided a surface processing apparatus provided with a reactor in which plasma is generated and in which a processed object whose surface is to be processed by the plasma is arranged, and a magnet plate for creating a point-cusp magnetic field distributed in a space in the reactor in which the plasma is generated, wherein the magnet plate is provided with a plurality of magnets arranged in a circular plane facing in parallel a surface of the object, one magnetic pole end face of each of the plurality of magnets is arranged at a position of each of a plurality of lattice points on the circular plane, the polarities of the magnetic pole end faces of two adjoining magnets are arranged to become opposite, and some of the magnets arranged at an outermost region of the circular plane among the plurality of magnets are reduced in magnetic force (coercive force).

In the above surface processing apparatus, by generating plasma by a plasma source at the inside space of the reactor, forming a point-cusp magnetic field periodically in the space where the plasma is generated, and arranging other magnets reduced in magnetic force (coercive force) at the outermost region in the periodic lattice structure, the periodicity of the magnetic field in the reactor is enhanced and the uniformity of the magnetic field is held.

In the surface processing apparatus of the present invention, preferably the above lattice points are those forming a square shape.

In the surface processing apparatus of the present invention, preferably the length of the some of the magnets arranged at the outermost region is shortened. By making the sectional area the same as the other magnets and shortening the length, the magnetic force of the magnets is reduced.

In the surface processing apparatus of the present invention, preferably the short length magnets are attached so that their magnetic pole end faces are positioned at the same heights as the magnetic pole end faces of the other magnets. By keeping the magnet plate surface of the magnet plate where the large number of magnets are provided in the same plane, it is possible for example to raise the periodicity of the distribution of the point-cusp magnetic field by the square lattice structure and to suitably reduce the magnetic field at the peripheral edge. Further, in the surface processing apparatus of the present invention, at least two magnets are arranged at positions of each of the lattice points.

According to the above surface processing apparatus of the present invention, since the magnets are arranged by, for example, a square lattice structure at the center of the magnet plate and magnets reduced in magnetic force are arranged at suitable locations at the outermost region, the periodicity of the point-cusp magnetic field created in the inside space of the reactor is maintained as much as possible even at the peripheral edges and the asymmetry of the distribution of the magnetic field at a region of the peripheral where the periodicity is disturbed is reduced. Therefore, the symmetry of the point-cusp magnetic field can be maintained and the surface of the substrate can be processed uniformly without making any major change to the hardware configuration.

BRIEF DESCRIPTION OF THE DRAWINGS

These and other objects and features of the present invention will become clear from the following description of the preferred embodiments with reference to the attached drawings, wherein.

DESCRIPTION OF THE PREFERRED EMBODIMENTS

Next, preferred embodiments of the present invention will be explained with reference to the attached drawings. The configurations, shapes, sizes, and relative arrangement of the parts explained in the embodiments are only shown schematically to an extent enabling understanding of the present invention. Therefore, the present invention is not limited to the embodiments explained below and can be modified in various ways within the scope of the technical concept expressed in the claims.

Figure 18:
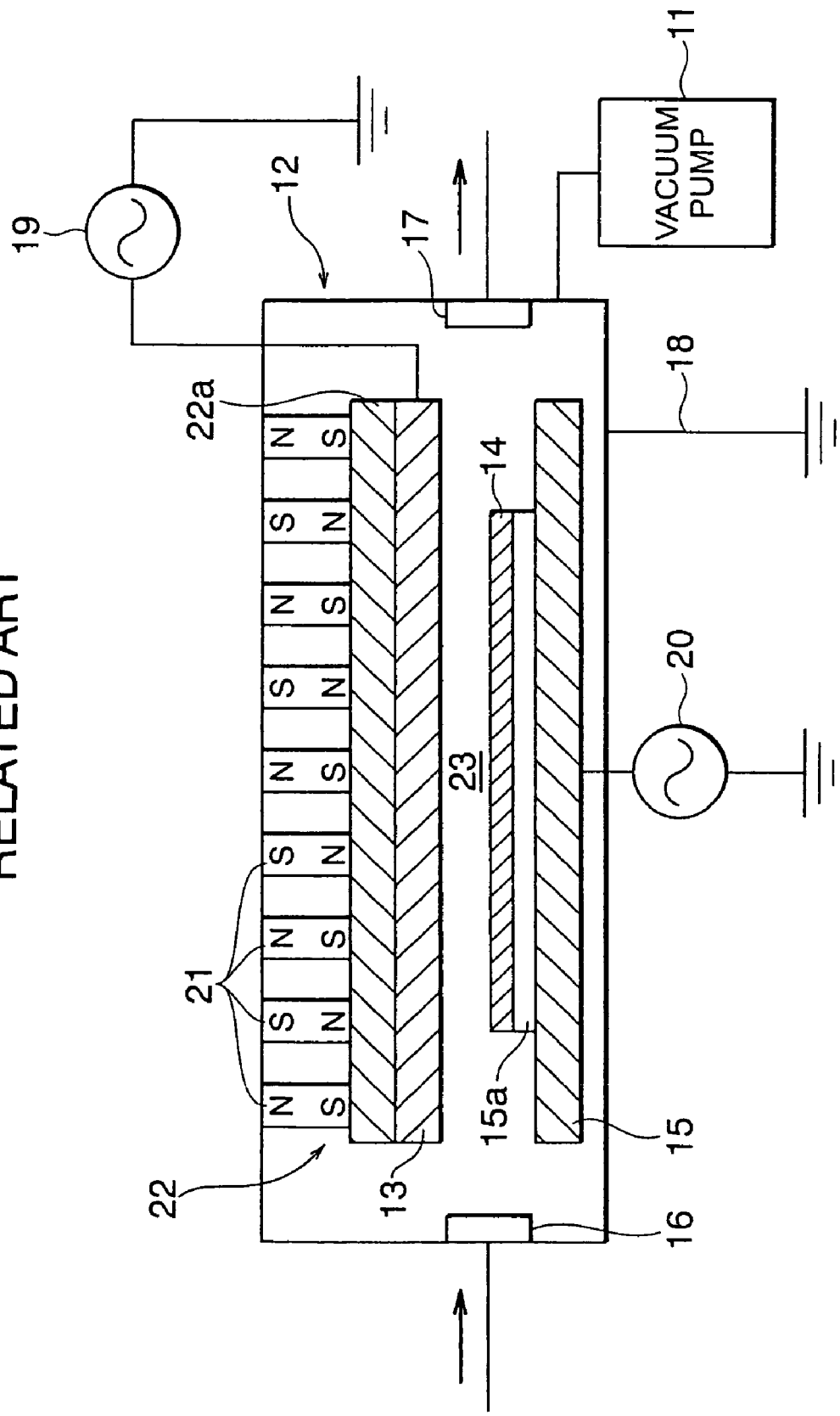
FIG. 18 is a longitudinal sectional view of the internal configuration of the surface processing apparatus.

The basic configuration of the surface processing apparatus according to the present invention is the same as the conventional configuration shown in FIG. 18. The basic configuration of the system of the present embodiment will also be explained with reference to FIG. 18. The hardware configuration was already explained with reference to FIG. 18, so reference will be made to the above explanation and no repeated explanation will be made here. The characterizing feature of the surface processing apparatus according to the present invention is the array structure of the large number of magnets 21 on the magnet plate 22 provided at the back side of the cathode 13. Therefore, in the explanation of the present embodiment the array structure of the magnets 21 and the distribution characteristics of the magnetic field brought about by that array structure is explained.

Figure 1:
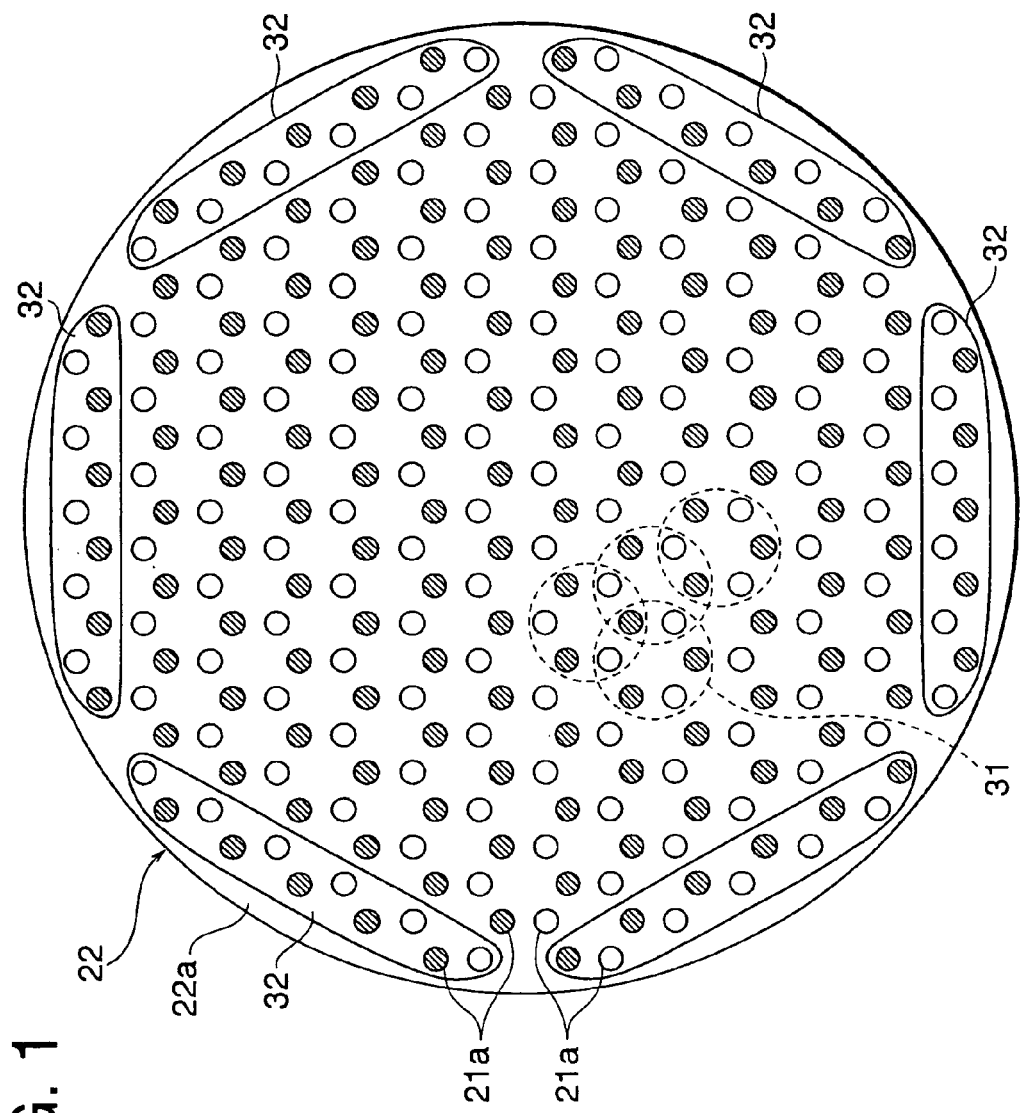
FIG. 1 is a plan view of a magnet array on a magnet plate provided in a surface processing apparatus according to a first embodiment of the present invention.

FIG. 1 shows a first embodiment of the magnet array structure in a surface processing apparatus according to the present invention. FIG. 1 is similar to FIG. 19 and is a plan view of the magnet plate 22. In the magnet plate 22, the array structure of the large number of magnets 21 having the same shapes and same magnetic strengths is, if deeming the positions of arrangement of magnets as lattice points, a honeycomb lattice structure comprised of a large number of unit honeycomb lattices 31 forming regular hexagonal shapes by six lattice points. As explained above, the magnet plate 22 has a disk shape, so the magnets 21 attached to the surface of the disk-shaped plate member 22a are laid and fastened in unit honeycomb lattices 31 on the circular surface of the plate member 22a without gaps and without sticking out.

The magnet plate 22 has a circular plate member 22a used for fastening the magnets of the magnet plate 22. The arrangement of magnets 21 of the above honeycomb lattice structure, as compared with the arrangement of magnets 21 of the conventional square lattice structure, makes it possible to attach the magnets to the plate member 22a so as to cover the entire surface of the plate member 22a as much as possible in the circular region similar to the plate member 22a. As shown in FIG. 1, it is possible to arrange the honeycomb lattices 31 giving periodicity in the center region of the disk-shaped plate member 22a. Further, magnets 21 having N-pole end faces 21a and magnets 21 having S-pole end faces 21a are arranged in lines as shown in the regions 32 even at the peripheral edge of the disk-shaped plate member 22a. Compared with the square lattice structure, these lines are arranged in proximity at close intervals. In this way, in the magnet plate 22 of the surface processing apparatus according to the present embodiment, a large number of magnets 21 are arranged by the honeycomb lattice structure and the symmetry of the distribution of magnetic field lines at the peripheral edge (outermost magnet region) of the magnet plate 22 is held as much as possible compared with the conventional square lattice structure.

Figure 2:
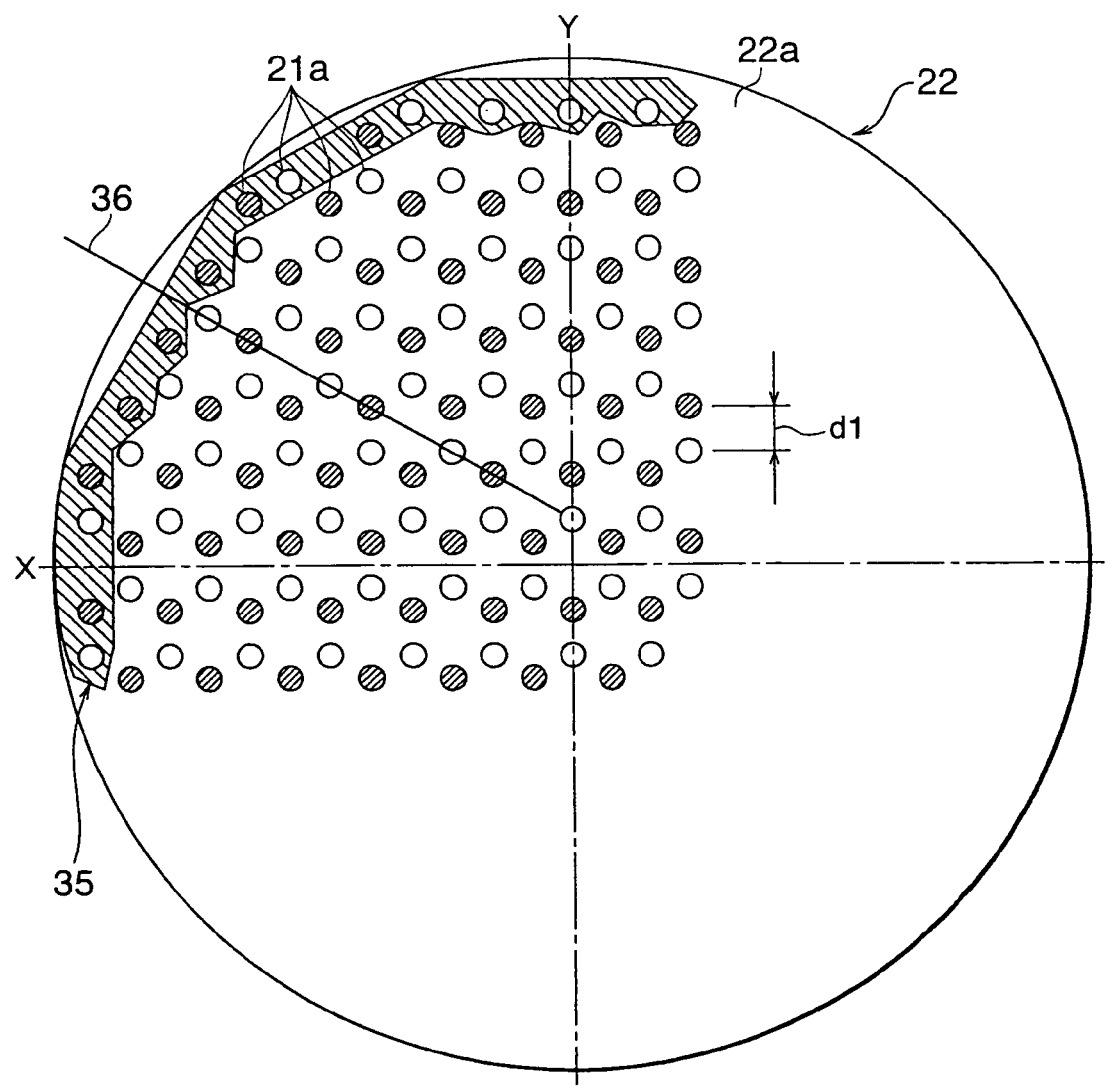
FIG. 2 is a plan view of a specific example of the magnet array on the magnet plate according to the first embodiment.
Figure 3:
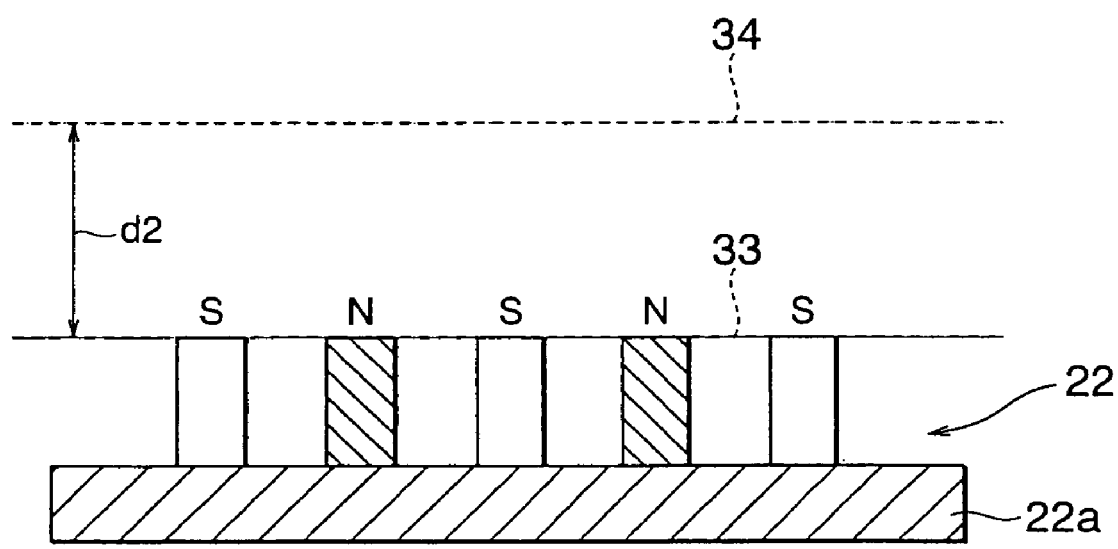
FIG. 3 is a partial side view of the magnet plate.

Next, the characteristics of the magnetic field of the above magnet plate 22 will be explained with reference to FIG. 2 and FIG. 3. The plan view of the magnet plate 22 shown in FIG. 2 is substantially the same as the one shown in FIG. 1. In the magnet plate 22 shown in FIG. 2, however, as a specific example, the magnets 21 which are used are cylindrical rod-shaped magnets of a length of 24 mm and a diameter of 8 mm (for example, NEOMAX-35 (Model Name) made by Sumitomo Special Metals) and are arranged in a honeycomb lattice structure where the distance between the two nearest adjoining magnets 21 on the disk-shaped plate member 22a is 17 mm. Further, in FIG. 3 showing a partial side view of the magnet plate 22, the magnet plate surface 33 is defined. A plane 34 positioned at a distance of for example 33 mm in a vertical direction from the magnet plate surface 33 is set and the plane 34 is defined as the planar region for measurement of the magnetic field. All of the magnets 21 on the magnet plate 22 have the same length. Therefore, the magnet plate surface 33 becomes a plane parallel to the plate member 22a.

Figure 4:
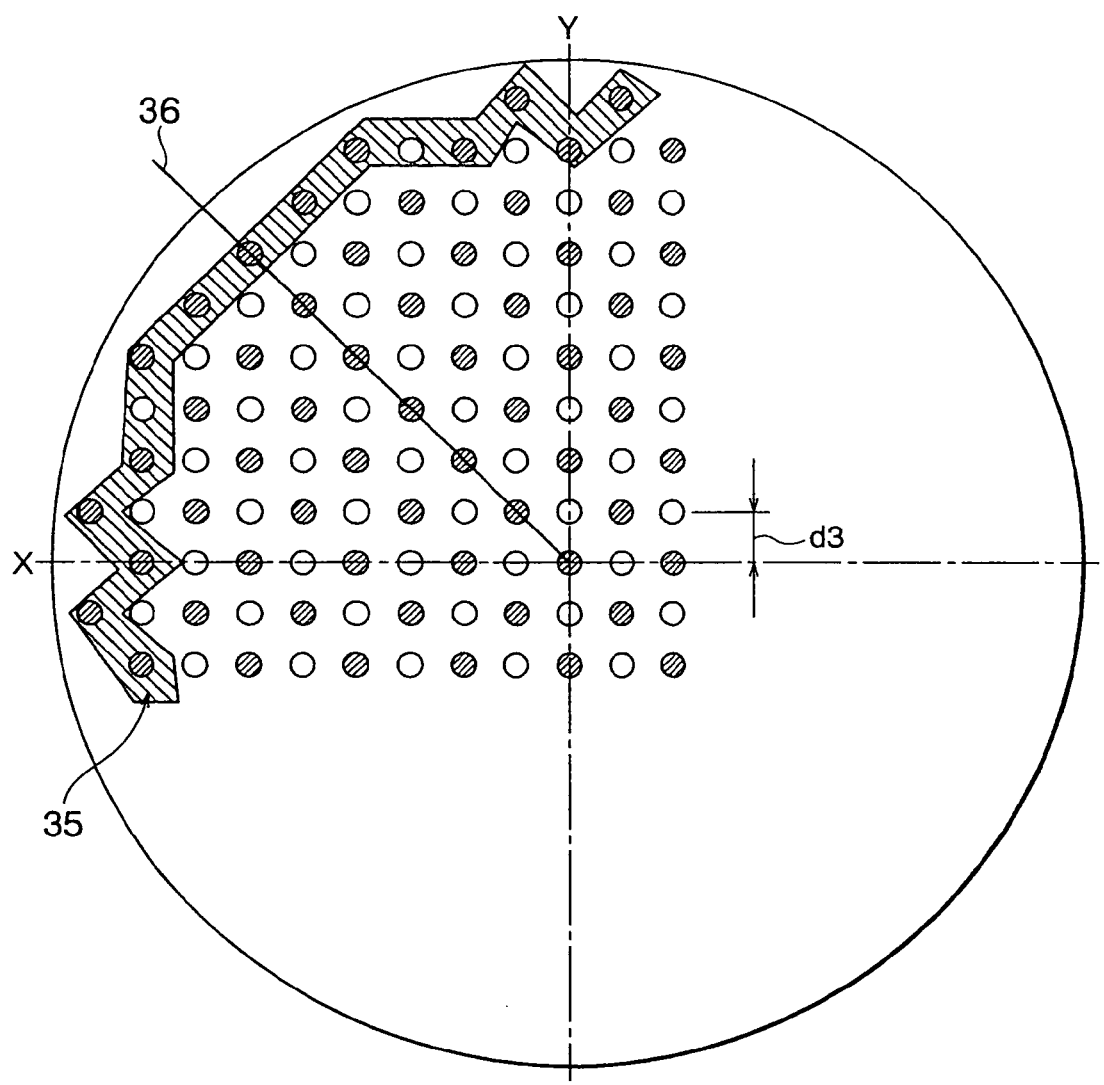
FIG. 4 is a plan view of a magnet array of a square lattice structure in the conventional magnet plate used for comparison.

When measuring the magnetic field strength at the above plane 34, according to the magnet plate 22 having the magnet array of a honeycomb lattice structure of the present embodiment, the magnetic field strength at the center of the magnet plate 22 typically changes in the range of 0 to 2 mT or so, while the magnetic field strength at the peripheral edge typically changes in the range of 0 to 6 mT or so. When comparing this with the magnetic field strength measured under the same conditions for a magnet plate 22 having a magnet array of the conventional square lattice structure shown in FIG. 4 (distance between nearest magnets of for example 20 mm) and having magnet lengths all the same as shown in FIG. 3, with the conventional magnet plate, the magnetic field strength of the center of the magnet plate 22 changes typically in the range of about 0 to 2 mT, while the magnetic field strength of the peripheral edge changes typically in the range of about 0 to 10 mT. That is, with the conventional magnet plate having the magnet array of the square lattice structure shown in FIG. 4, a distribution of magnetic field strength about five times stronger than the space corresponding to the center appears linearly in the diagonal direction of the unit square lattices in the magnet array in a space at least 10 mm from the magnet plate surface 33 of the peripheral edge, while with the magnet plate 22 having the magnet array of the honeycomb lattice structure shown in FIG. 1 and FIG. 2, a distribution of the magnetic field strength suppressed in magnetic field strength to about three times the space corresponding to the center appears circularly in the space at least 10 mm from the magnet plate surface 33 of the peripheral edge. With the magnet plate 22 of the present embodiment, the outermost magnet region 35 shown in FIG. 2 has a substantially circular shape along the periphery of the peripheral edge of the circularly shaped magnet plate 22 according to the present embodiment. This corresponds to the region of distribution of magnetic field strength suppressed to about three times the magnetic field strength of the center.

Figure 5:
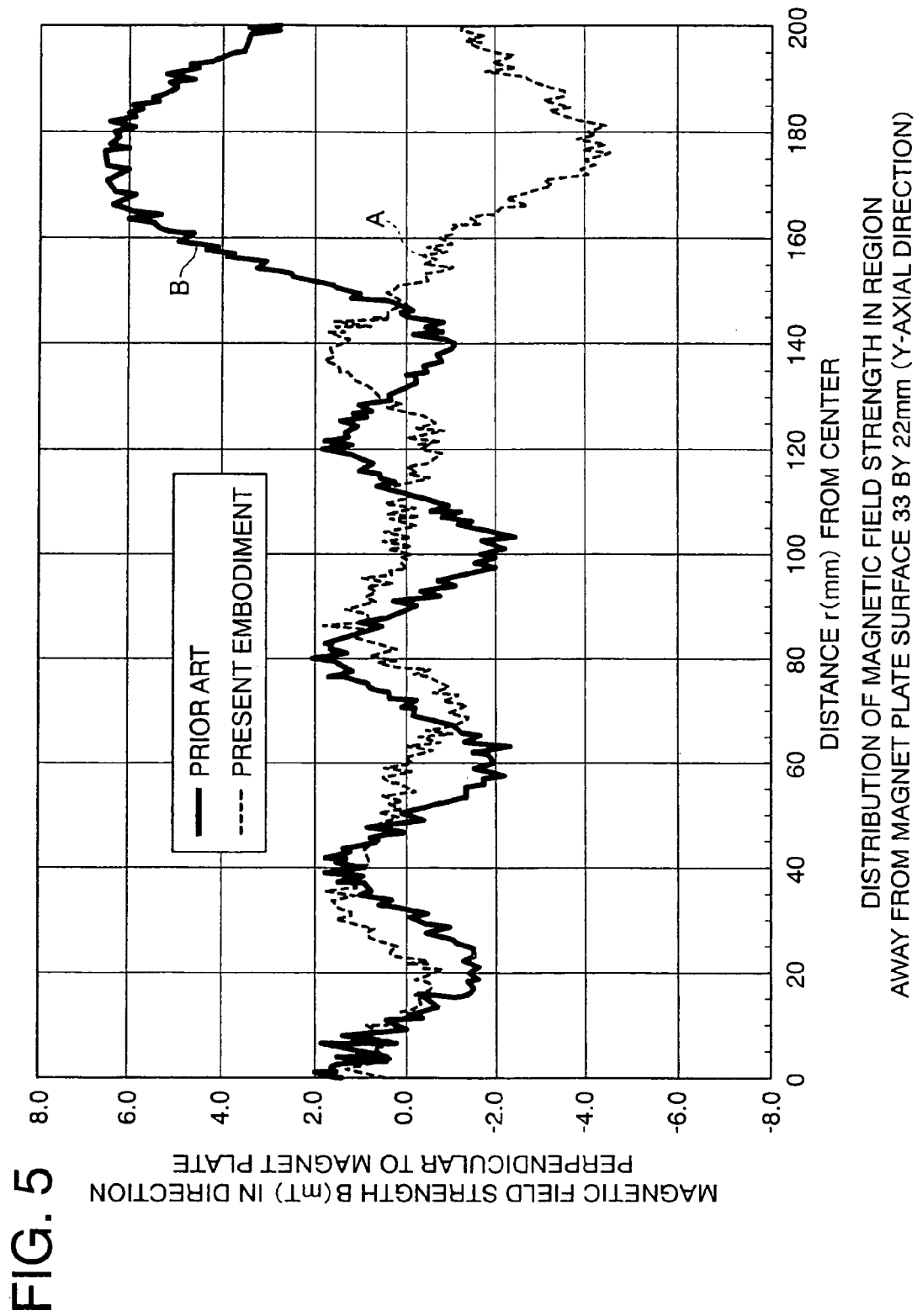
FIG. 5 is a graph of the distribution of magnetic field strength (Y-axial direction) for comparing the magnet plate according to the first embodiment and the conventional magnet plate.
Figure 6:
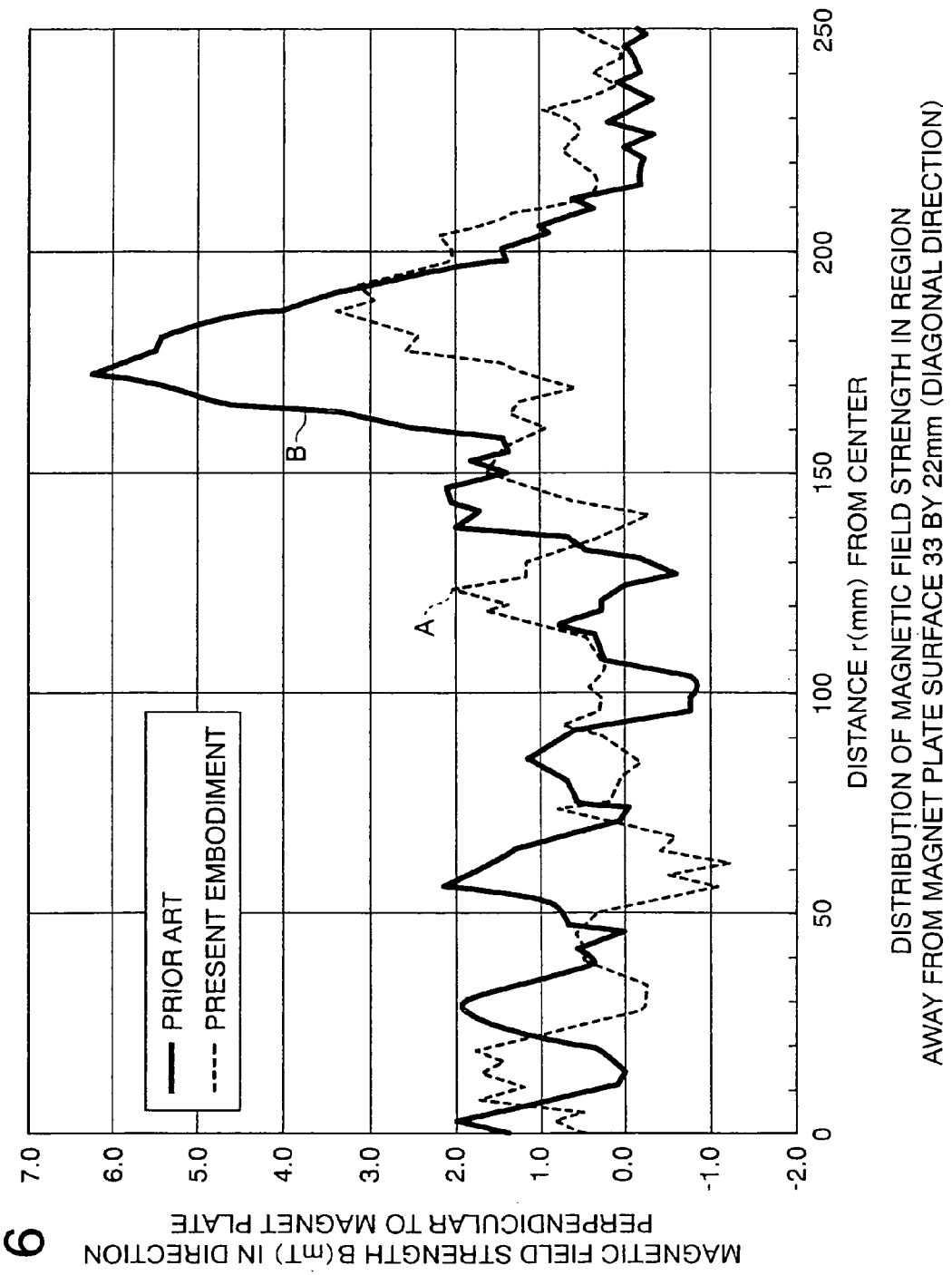
FIG. 6 is a graph of the distribution of magnetic field strength (diagonal direction) for comparing the magnet plate according to the first embodiment and the conventional magnet plate.

Referring to FIG. 5 and FIG. 6, specific examples of measurement of the distribution of magnetic field strength of the magnet plate 22 according to the present embodiment and magnet plate 22 of the prior art will be compared. The magnet plate 22 according to the present embodiment has a magnet array of the honeycomb lattice structure shown in FIG. 2, while the conventional magnet plate 22 has the magnet array of the square lattice structure shown in FIG. 4. The distribution of magnetic field strength is the distribution of magnetic field strength in the direction perpendicular to the magnet plate 22 measured at a plane 34 away from the magnet plate surface 33 by 22 mm as shown in FIG. 3. FIG. 5 shows the distribution of magnetic field strength in the Y-axial direction, while FIG. 6 shows the distribution of magnetic field strength in the diagonal direction (direction of line 36 shown in FIG. 4). In FIG. 5 and FIG. 6, the distribution characteristic A shows the distribution of magnetic field strength for the magnet plate 22 according to the present embodiment, while distribution characteristic B shows the distribution of magnetic field strength for the conventional magnet plate 22.

As shown in FIG. 5, at the center region of the magnet plate (range of 0 to close to 140 mm in the radial direction from the center), in the distribution characteristics A and B, the magnetic field changes in the range of −2.0 to 2.0 mT. Outward from 140 mm, the field changes greatly to about 6.0 mT in the distribution characteristic B, while it changes to about −4.0 mT in the distribution characteristic A. Further, as shown in FIG. 6, in the center region of the magnet plate 22 (range of 0 to close to 140 mm in the radial direction from the center), in the distribution characteristics A and B, the magnetic field changes in the range of about −1.0 to 2.0 mT, while outward from 140 mm, changes greatly to about 6.0 mT in the distribution characteristic B and changes to about 3.0 mT in the distribution characteristic A.

Due to the above, it is learned that the magnetic field strength of the peripheral edge of the magnet plate 22 having a magnet array of a honeycomb lattice structure is improved compared with the magnetic field strength of the peripheral edge of the magnet plate 22 having a magnet array of a square lattice structure.

When microprocessing a silicon oxide film on a substrate 14 by the surface processing apparatus configured using a magnet plate 22 provided with a large number of magnets 21 arranged in the honeycomb lattice structure as explained above, as shown in FIG. 18, the distribution of the magnetic field strength of the point-cusp magnetic field of a predetermined space corresponding to the peripheral edge of the magnet plate 22 is improved, so the problem of the lack of uniformity of processing of the peripheral edge of the substrate which arose due to the magnet array of the conventional square lattice structure can be solved.

Figure 7:
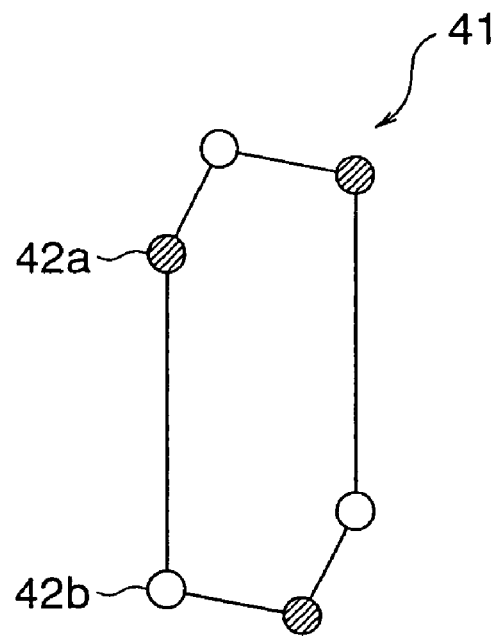
FIG. 7 is a plan view of a magnet array of a honeycomb lattice structure on the magnet plate provided in a surface processing apparatus according to a second embodiment of the present invention.

Next, FIG. 7 shows a second embodiment of the present invention. The surface processing apparatus according to this embodiment is provided with a magnet plate having a magnet array of a honeycomb lattice structure similar to the first embodiment, but the form of the honeycomb lattices forming the magnet array is modified. Therefore, FIG. 7 shows one honeycomb lattice 41 having the characteristic form. In this honeycomb lattice 41, magnets having N-pole end faces 42a and magnets having S-pole end faces 42b are arranged at the six lattice points forming the hexagonal shape. The honeycomb lattice 41 is characterized in that it does not form a regular hexagonal shape and in that the three pairs of facing sides between the six lattice points are formed parallel. So long as the three pairs of facing sides are parallel, the sides may be of any lengths. The above actions and effects can be sufficiently achieved even by a magnet array of a honeycomb lattice structure created by honeycomb lattices 41 having this form. To achieve a higher effect, however, it is preferable that the length of the longest sides among the sides of the hexagonal shape be not more than two times the length of the shortest sides in the unit honeycomb lattice 41 shown in FIG. 7.

Figure 8:
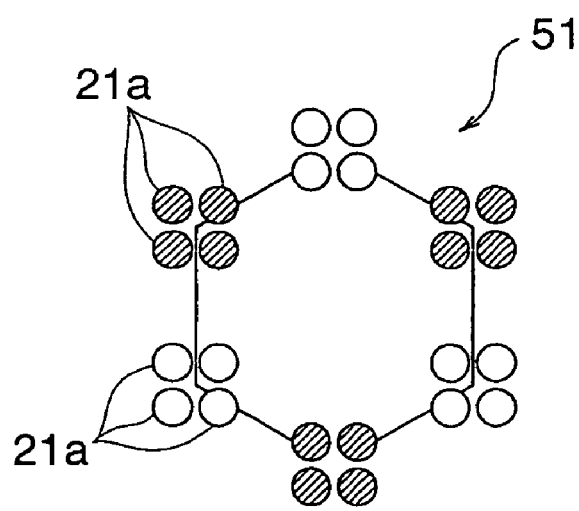
FIG. 8 is a plan view of a magnet array of a honeycomb lattice structure on the magnet plate provided in a surface processing apparatus according to a third embodiment of the present invention.

Next, FIG. 8 shows a third embodiment of the present invention. The surface processing apparatus according to this embodiment is also provided with a magnet plate having a magnet array of a honeycomb lattice structure in the same way as the first embodiment, but the type of the honeycomb lattices forming the magnet array is modified. FIG. 8 shows one honeycomb lattice 51 forming a unit having a characteristic form. The honeycomb lattice 51 according to this embodiment is configured so that for example four magnets 21 having the same pole end faces 21a are arranged at each of the lattice points in the array of lattice points forming the regular hexagonal shape. The number of magnets arranged at each lattice point forming the regular hexagonal shape need only be more than one (two or more). Any number can be used in accordance with the application or object. The above actions and effects can be sufficiently achieved even by a magnet array of a honeycomb lattice structure created by the honeycomb lattices 51 having this form.

Figure 9:
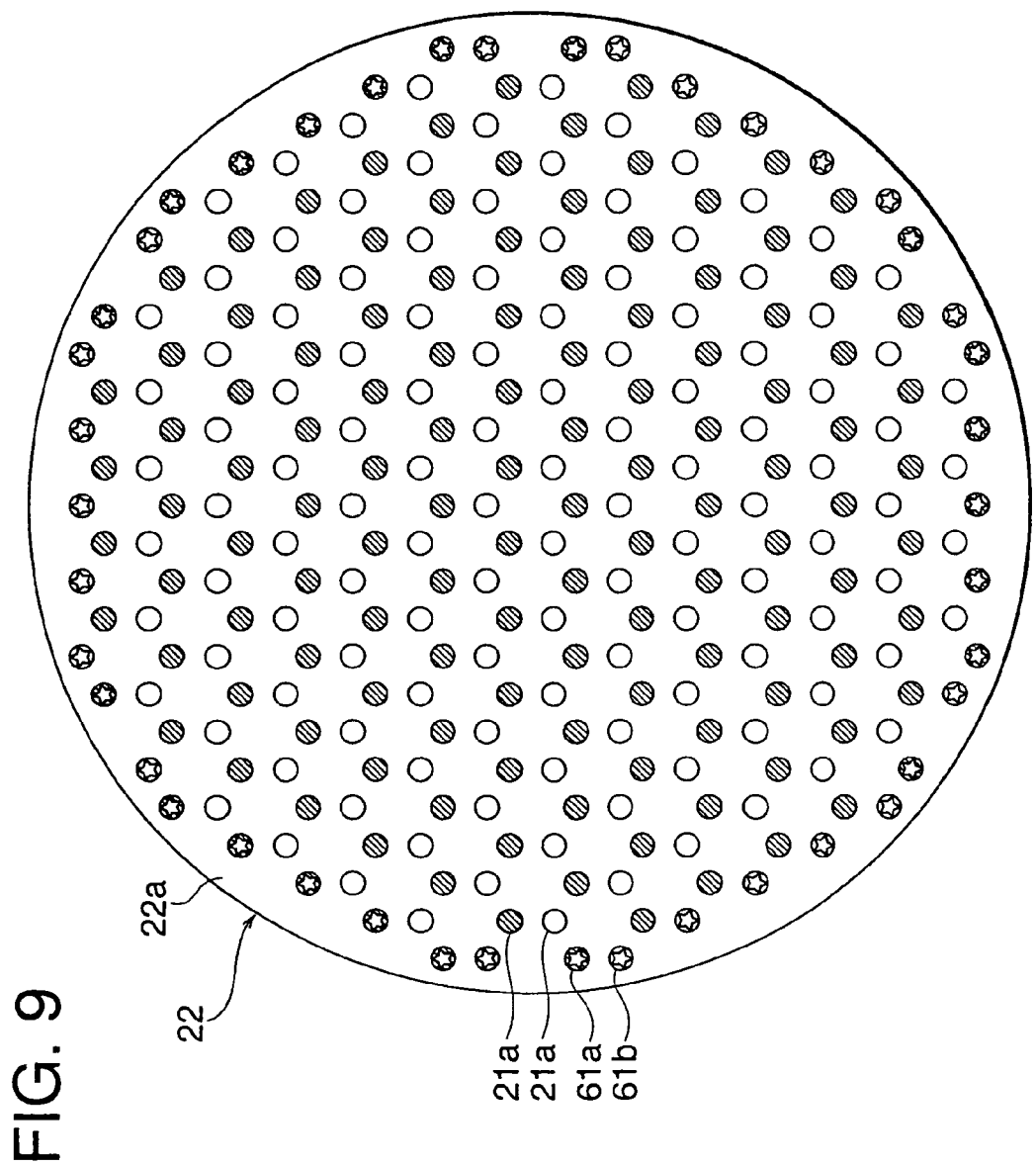
FIG. 9 is a plan view of a magnet array on a magnet plate provided in a surface processing apparatus according to a fourth embodiment of the present invention.
Figure 10:
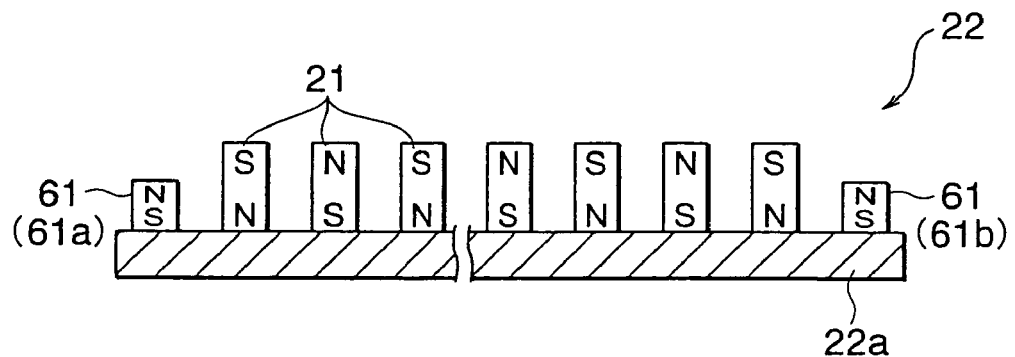
FIG. 10 is a partial side view of the magnet plate according to the fourth embodiment.

Next, a fourth embodiment of the present invention will be explained with reference to FIG. 9 and FIG. 10. This embodiment is configured so that in addition to the magnets on the magnet plate 22 being arranged for example by the honeycomb lattice structure of the first embodiment explained above, a plurality of magnets 61 of preferably one-half the magnet length are arranged at required locations of the outermost peripheral edge. The magnets 61 have end faces of N poles 61a or S poles 61b depending on their location. By making the length of the magnets one-half in this way, the magnetic field strength is weakened and the distribution of magnetic field strength at the peripheral edge of the magnet plate 22 is controlled to become equal to that explained in the above first embodiment.

Figure 11:
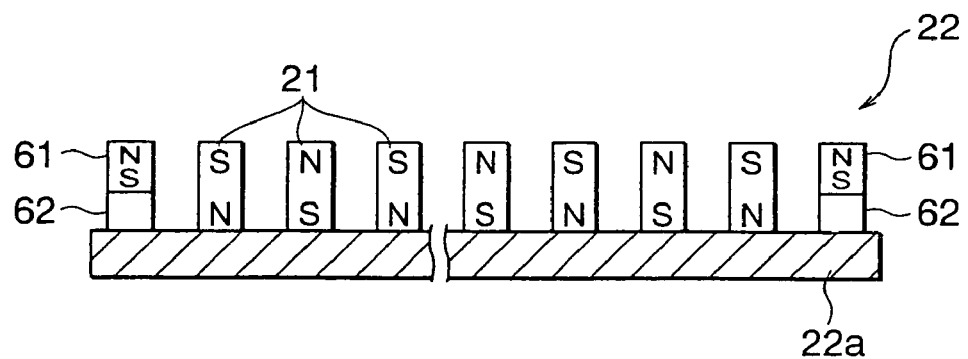
FIG. 11 is a partial side view of a modification of the magnet plate according to the fourth embodiment.

In the fourth embodiment, the distribution of the magnetic field strength at the required locations was controlled by preferably halving the outermost magnets 61 of the one-half length, but the plane 34 of the region where the distribution of the magnetic field strength is measured is preferably made the same height, so it is also possible to provide a support base 62 as shown in FIG. 11 to make the plane 34 a constant height.

Figure 12:
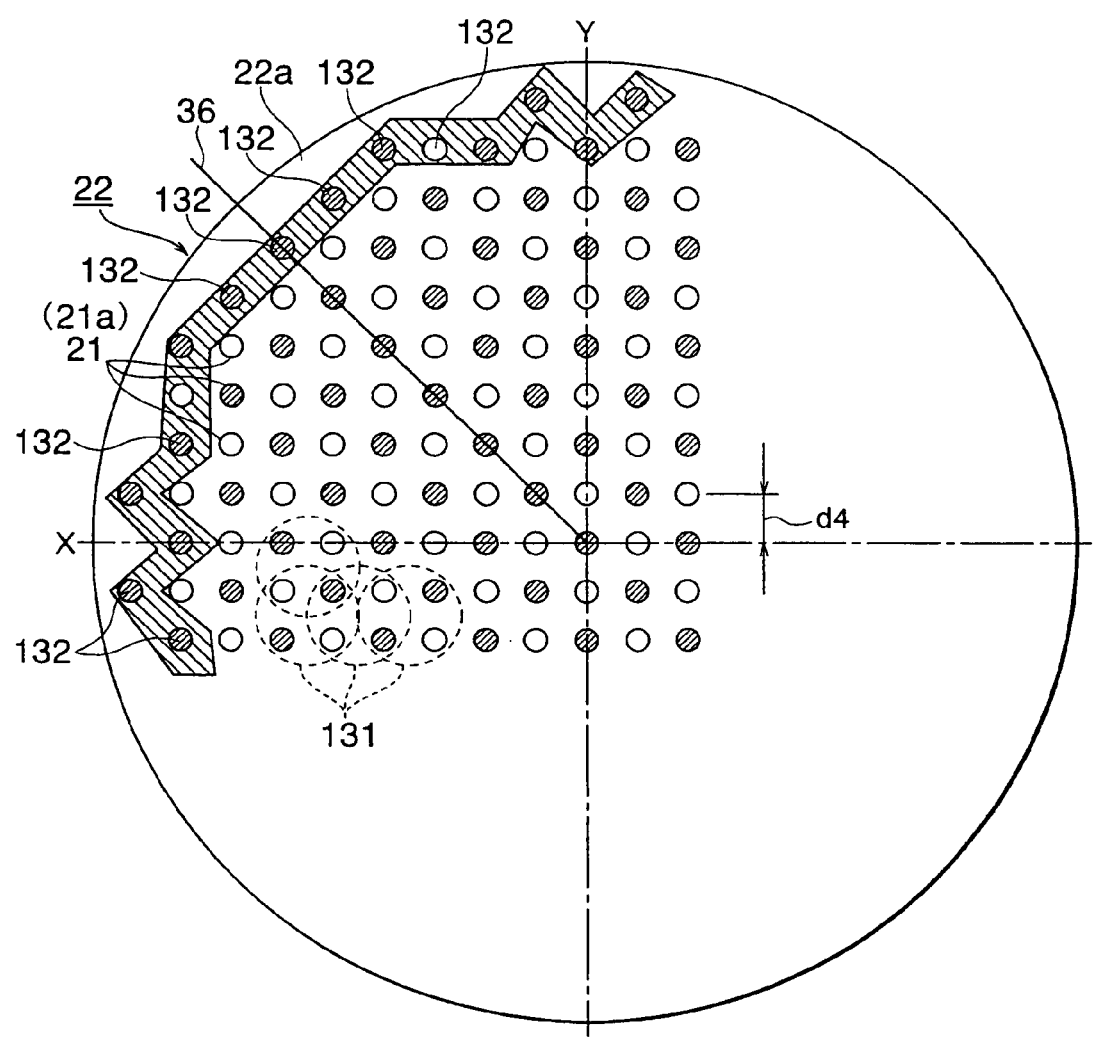
FIG. 12 is a plan view of a specific example of a magnet array on a magnet plate provided in a surface processing apparatus according to a fifth embodiment of the present invention.

Next, a fifth embodiment of the magnet array structure will be explained with reference to FIG. 12 and FIG. 13. FIG. 12 is a plan view of the magnet plate 22, while FIG. 13 is a partial side view of part of the magnet plate 22 in section.

The magnet plate 22 according to the present embodiment has, as its basic configuration, a magnet array of the square lattice structure explained as the prior art. A large number of magnets 21 are arranged based on the square lattice structure explained above in the region from the center of the magnet plate 22 to near the peripheral edge. In this region, a large number of square lattices 131 are arranged with periodicity. In an array of magnets 21 according to this square lattice structure, the polarities of the magnetic poles of any two nearest adjoining magnets 21 are opposite and therefore N poles and S poles are alternately arranged. A point-cusp magnetic field is formed by this square lattice structure. In FIG. 12, the large number of magnets 21 are shown as circular end faces 21a. Further, among the circular end faces 21a, the hatched circular end faces show N-pole end faces, while the simple circular end faces show S-pole end faces.

Further, at the outside of the magnet array according to the above square lattice structure in the region of disturbance of the periodicity at the outermost region (the hatching region) of the magnet plate 22, that is, at the outermost side of the peripheral edge of the plate member 22a, a plurality of cylindrical rod-shaped magnets 132 having magnetic poles at the two ends in the same way as the magnets 21 but having lengths shorter than the magnets 21 are arranged. Specifically, the length of the magnets 132 is preferably one-half of the length of the magnets 21. The magnetic field created by the magnets 132 close to the peripheral edge of the magnet plate 22 is weaker than the magnetic field created by the magnets 21 arranged at the center of the magnet plate 22. The magnets 132 create a weak bipolar magnetic field.

Figure 13:
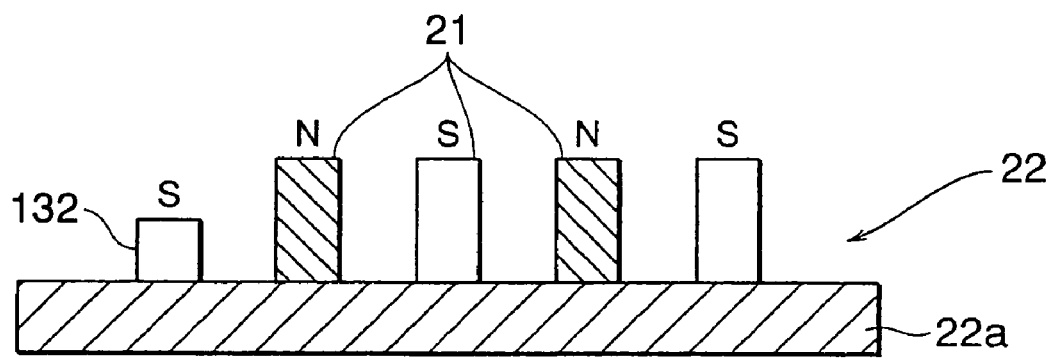
FIG. 13 is a partial side view of the magnet plate according to the fifth embodiment.
Figure 14:
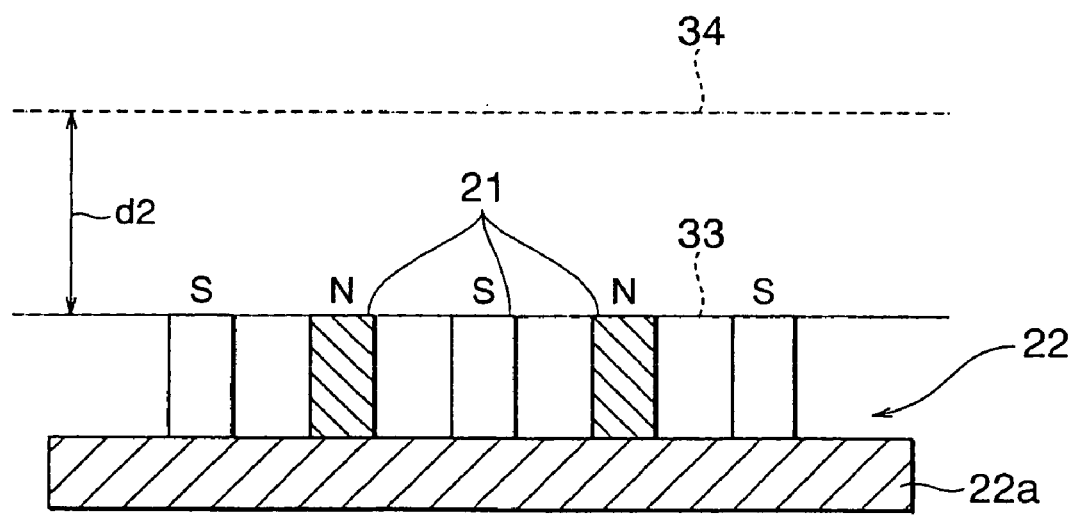
FIG. 14 is a partial side view of a conventional magnet plate.

Next, the characteristics relating to the magnetic field of the magnet plate 22 will be explained with reference to the above FIGS. 12 and 13, and FIG. 14 showing the conventional configuration for comparison. In the magnet plate 22 shown in FIG. 12, the magnets 21 used are cylindrical rod-shaped magnets of a length of 24 mm and a diameter of 8 mm as explained above (for example, NEOMAX-35 (Model Name) made by Sumitomo Special Metals) and are arranged on the disk-shaped plate member 22a in a square lattice structure with a distance d4 between two nearest adjoining magnets 21. The distance d4 is 20 mm. Further, in FIGS. 13 and 14 showing partial side views of the magnet plate 22, the magnet plate surface 33 is defined. A plane 34 positioned at a distance d2 of for example 22 mm in a vertical direction from the magnet plate surface 33 is set and the plane 34 is defined as the planar region for measurement of the magnetic field. All of the magnets 21 on the magnet plate 22 have the same length (same shape and material). Therefore, the magnetic plate surface 33 becomes a plane parallel to the plate member 22a. As opposed to this, in the configuration according to the present embodiment shown in FIG. 13, short length magnets 132 are arranged at the outermost region. Therefore, the magnets 132 at the peripheral edge of the magnet plate 22 are arranged in a state not reaching the magnet plate surface 33.

Figure 15:
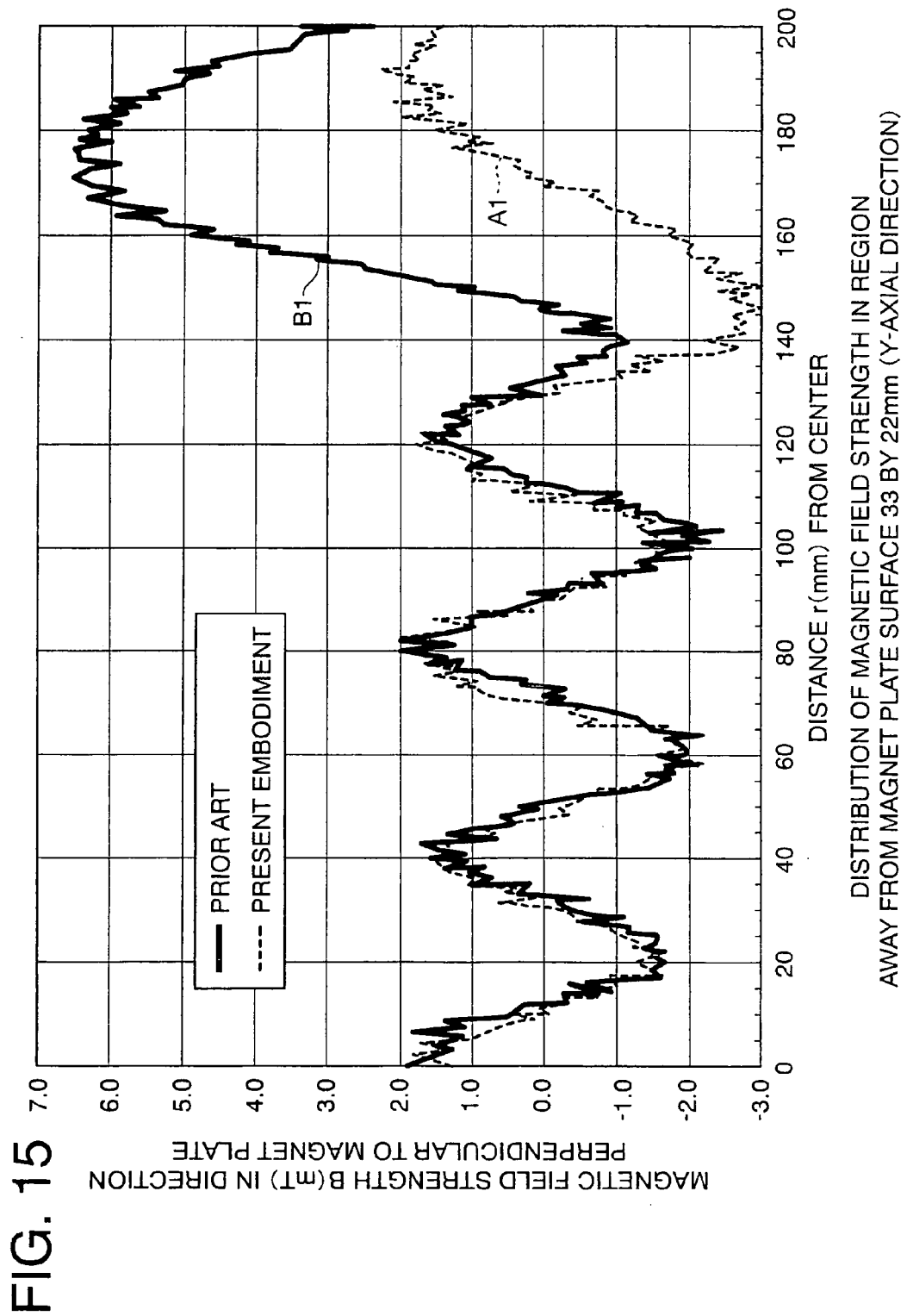
FIG. 15 is a graph of the distribution of magnetic field strength (Y-axial direction) for comparing the magnet plates according to the fifth embodiment and the conventional magnet plate.
Figure 16:
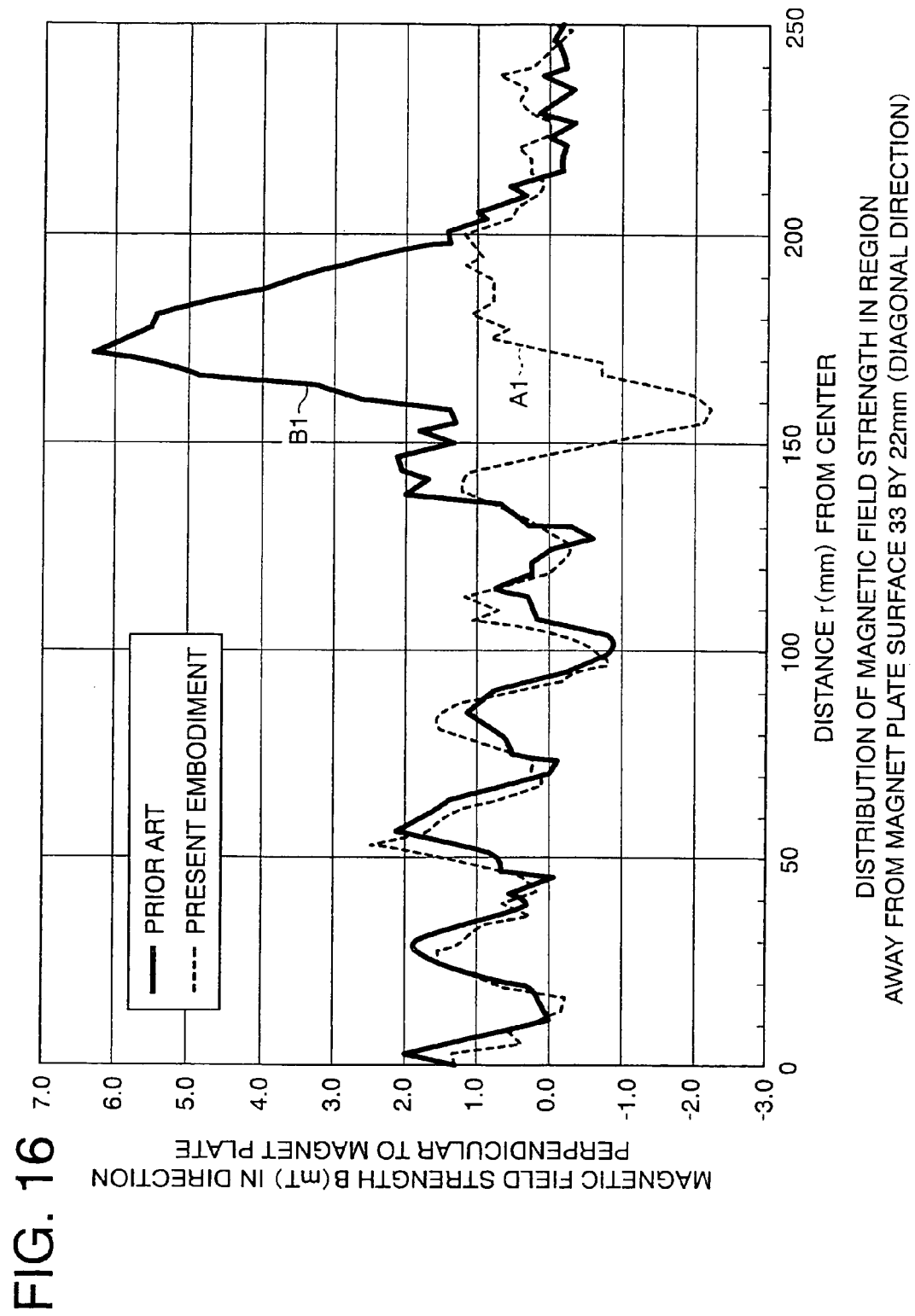
FIG. 16 is a graph of the distribution of magnetic field strength (diagonal direction) for comparing a magnet plate according to the fifth embodiment and a conventional magnet plate.
Figure 19:
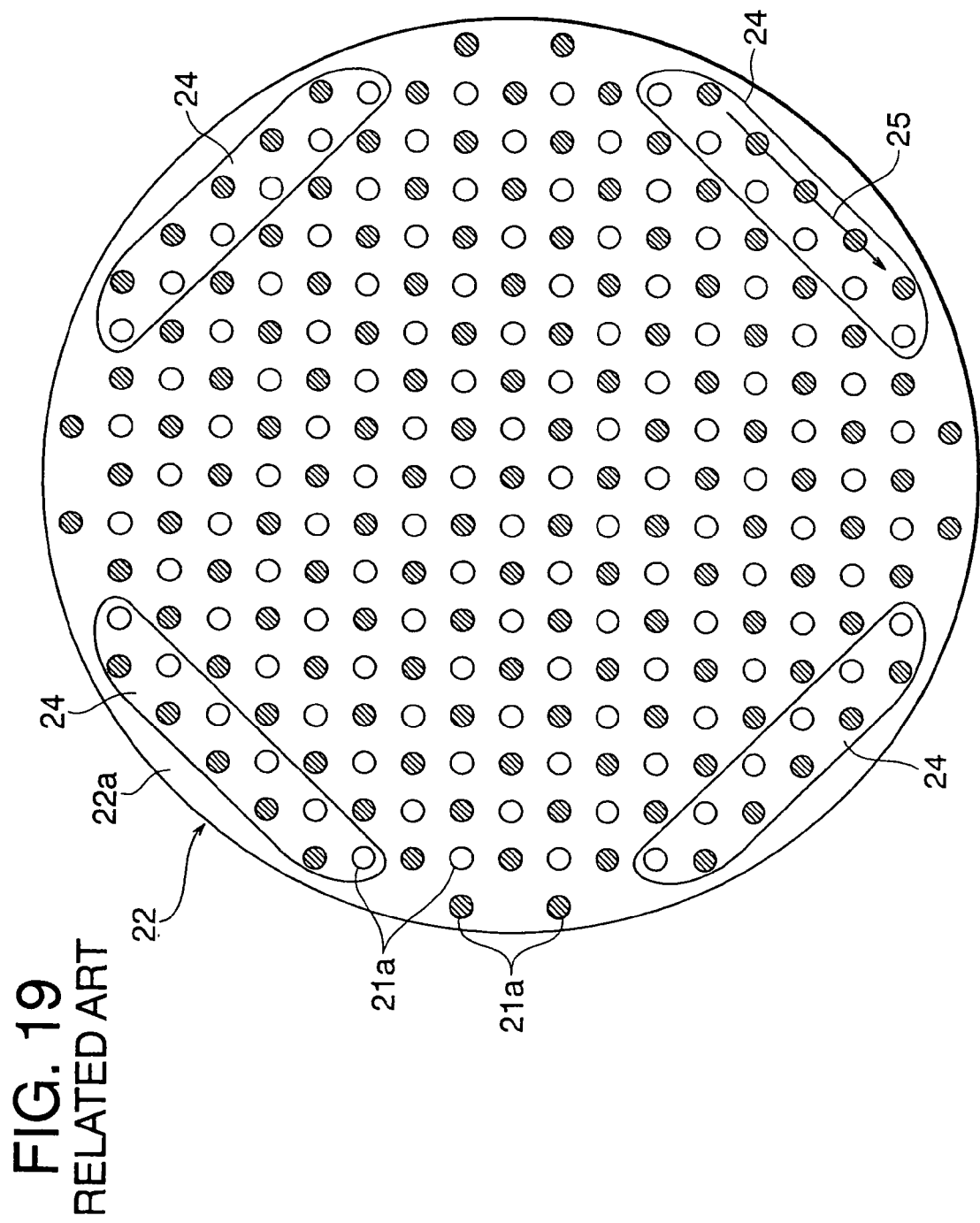
FIG. 19 is a plan view of a magnet array on a magnet plate used in the conventional surface processing apparatus.

Referring to FIG. 15 and FIG. 16, examples of measurement of the distributions of magnetic field strength of the magnet plate 22 according to the present embodiment having the configuration shown in FIGS. 12 and 13 and the conventional magnet plate 22 shown in FIGS. 19 and 13 will be compared. The magnet plate 22 according to the present embodiment has the magnet array of the square lattice structure shown in FIG. 12 and FIG. 13, while the conventional magnet plate 22 has a magnet array of a conventional square lattice structure shown in FIG. 19 and FIG. 14. The distribution of magnetic field strength is the distribution relating to the magnetic field strength in a direction perpendicular to the magnet plate 22 measured at the plane 34 separated from the magnet plate surface 33 by 22 mm in the array shown in FIGS. 13 and 14. FIG. 15 shows the distribution of magnetic field strength in the Y-axial direction, while FIG. 16 shows the distribution of magnetic field strength in the diagonal direction (the direction of line 36). In FIG. 15 an FIG. 16, the distribution characteristic A1 shows the distribution of magnetic field strength relating to the magnet plate 22 according to this embodiment, while the distribution characteristic B1 shows the distribution of magnetic field strength relating to the conventional magnet plate 22.

As shown in FIG. 15, in the center region of the magnet plate 22 (range of 0 to close to 140 mm in radial direction from center), the magnetic field changes in the range of −2.0 to 2.0 mT in the distribution characteristics A1 and B1. And further outward from 140 mm, the magnetic field changes greatly at about 6.0 mT in the distribution characteristic B1, while the magnetic field changes in the range of −3.0 to 2.0 mT or so in the distribution characteristic A1. Further, as shown in FIG. 16, in the center region of the magnet plate 22 (range of 0 to close to 140 mm in radial direction from center), the magnetic field changes in the range of 0.0 to 2.0 mT in the distribution characteristics A1 and B1. And further outward from 140 mm, the magnetic field changes greatly to about 6.0 mT in the distribution characteristic B1, while the magnetic field changes in the range of −2.0 to 1.0 mT or so in the distribution characteristic A1.

Due to the above, it is learned that the magnetic field strength at the peripheral edge of the magnet plate 22 having the magnet array of the square lattice structure where the magnets 132 are arranged at required locations at the outermost region is improved compared with the magnetic field strength at the peripheral edge of the magnet plate 22 having the magnet array of the conventional square lattice structure.

As explained above, when minutely processing a silicon oxide film on the substrate 14 by the hardware configuration as shown in FIG. 18 using the surface processing apparatus configured using the magnet plate 22 provided with a large number of magnets 21 arranged in the square lattice structure according to the present embodiment, the distribution of magnetic field strength in a predetermined space corresponding to the peripheral edge of the magnet plate 22 was improved, so the problem of lack of uniformity of processing of the peripheral edge of the substrate which arises due to the magnet array of the conventional square lattice structure could be solved.

The above embodiment can be modified in the following way. In the above embodiment, the magnets 132 at the outermost region were made shorter in length, but it is also possible instead to keep the lengths of the magnets the same and make the sectional area of the magnets smaller. Further, even if the magnets 132 are the same shape as the magnets 21, it is possible to make magnets creating a weak magnetic field by creating magnets by a material having a small coercive force. Further, the magnitude of the coercive force may be made the same as that of the magnets 21 and the distance from the magnet plate surface 33 of the magnets used in regions where the periodicity of the magnet array is disturbed made longer than the distance from the magnet plate surface 33 of the magnets used in regions where the periodicity of the magnet array is maintained so as to achieve uniformity of the point-cusp magnetic field in the inside space of the reactor 12. Further, it is possible to suitably combine or simultaneously work the above configurations so as to achieve similar effects as those explained above.

Figure 17:
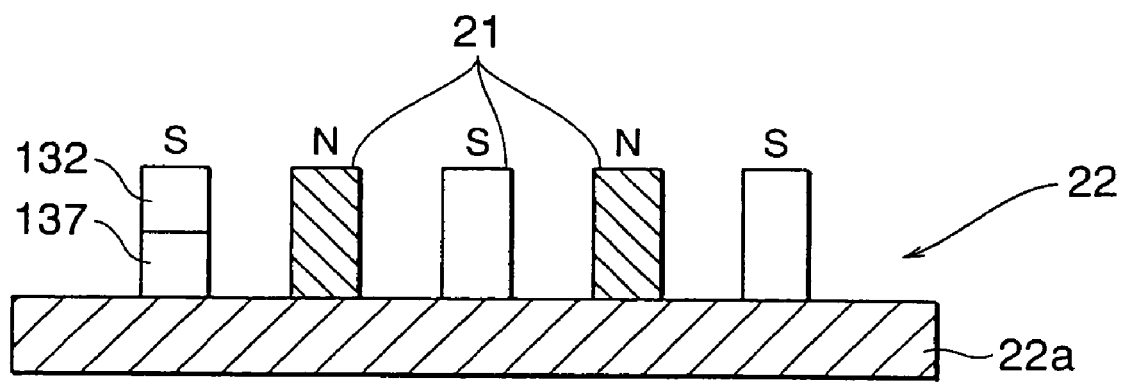
FIG. 17 is a partial side view of the magnet plate according to a modification of the fifth embodiment.

Further, as shown in FIG. 17, it is also possible to attach an aluminum support base 137 at the plate member 22a side of the magnets 132 shortened in length so as to make them the same length as the other long magnets 21.

Further, it is possible to arrange at least two magnets 21 corresponding to each lattice point of the square.

In the magnet plates 22 of the above embodiments, a large number of magnets 21 were arranged on one surface of the plate member 22a having a required thickness, but the plate member 22a may also be made thicker and the magnets 21 arranged inside the plate member or the magnets 21 may be arranged alone without using the plate member 22a to create a similar magnet array structure. Further, the magnet plate 22 may be arranged at a position behind the cathode 13. Further, it may be arranged at the outside of the reactor 12. The magnet plate 22 may be arranged in the reactor 12 with the plate member 22a at the inside or the magnets at the inside.

In the previously explained embodiments, the magnet plate 22 of the surface processing apparatus according to the present invention can of course be realized by combining any of the configurations of the different embodiments. Further, the magnets may also be magnets produced electromagnetically in addition to ordinary permanent magnets. If using electromagnets, there is the advantage that the magnetic field strength created by the individual magnets can be freely adjusted.

In the above fifth embodiment, the large number of magnets provided on the magnet plate were typically arranged by the square lattice structure at the center of the magnet plate and different magnets for example shortened in length and reduced in magnetic force were arranged at suitable locations at the outermost region, but even if making all of the magnets the same shape and the same coercive force, it is possible to obtain similar effects as in the above embodiments by setting the outermost magnets further apart.

The present disclosure relates to subject matter contained in Japanese Patent Application Nos. 2001-238279 and 2001-238280 filed on Aug. 6, 2002, the disclosures of which are expressly incorporated herein by reference in their entirety.

What is claimed is:
1. A surface processing apparatus comprising:
   a reaction container in which plasma is generated and in which an object having a surface to be processed by the plasma is placed; and
   a magnet plate, provided in said reaction container, for generating point cusp magnetic fields distributed in space in said reaction chamber in which the plasma is generated,
   said magnet plate including a plurality of magnets arranged on a circular surface thereof to be opposed parallel with the surface to be processed, said magnets having magnetic pole end surfaces at ends remote from said magnetic plate, respectively, disposed at lattice points forming regular hexagonal shapes on the circular surface, wherein polarities of adjacent magnetic pole end surfaces of said magnets are opposite to each other, wherein polarities of the magnetic pole end surfaces of said magnets disposed at diagonal lattice points of respective regular hexagonal shapes are opposite to each other, and wherein adjacent a peripheral portion of said magnet plate, first rows of said magnets having said magnetic pole end surfaces of a first magnetic polarity and second rows of said magnets having said magnetic pole end surfaces of a second magnetic polarity which is opposite to the first magnetic polarity, generally constitute a hexagonal shape as a whole.

2. An apparatus according to claim 1, wherein a plurality of said magnets having the same magnetic pole end surfaces are provided at each of the lattice points.

3. An apparatus according to claim 1, wherein said magnets disposed at an outmost area have a length smaller than a length of the magnets disposed in a central area to provide relatively smaller magnetic forces in the outermost area.

* * * * *